United States Patent [19]
Marshall, III

[11] 3,921,012
[45] Nov. 18, 1975

[54] WIDE-RANGE CURRENT-TO-FREQUENCY CONVERTER

[75] Inventor: J. Howard Marshall, III, Pasadena, Calif.

[73] Assignee: MDH Industries Inc., Pasadena, Calif.

[22] Filed: Nov. 11, 1974

[21] Appl. No.: 522,744

[52] U.S. Cl.............. 307/271; 307/228; 307/235 K; 328/151
[51] Int. Cl.$^2$ ........................................... H03K 1/16
[58] Field of Search............ 307/235 R, 235 K, 228, 307/271; 328/115, 116, 150, 151

[56] References Cited

UNITED STATES PATENTS

| | | | |
|---|---|---|---|
| 3,350,574 | 10/1967 | James | 307/235 X |
| 3,482,116 | 12/1969 | James | 307/228 X |

*Primary Examiner*—Paul L. Gensler
*Attorney, Agent, or Firm*—Arthur V. Doble

[57] ABSTRACT

Improved wide-range current-to-frequency converter for analog-to-digital conversion of low-level signals in a simple, low-power, self-zeroing circuit utilizing capacitive feedback, which virtually eliminates the effects of voltage offsets at the input of the converter while avoiding large leakage currents, without the need for complicated and bulky range-changing switches, external zeroing using either automatic or manual techniques, or preceding electrometer amplifiers, includes a low-leakage charge-sensitive amplifier, a gated multivibrator, a charge pulser and a capacitive divider. The gated multivibrator under the control of the charge-sensitive amplifier at the input of the converter produces discrete pulses, which in turn cause the charge pulser to generate discrete units of charge, which are reduced in magnitude by the capacitive divider to become the charge-feedback pulses applied to the input of the charge-sensitive amplifier. This amplifier compares the feedback current consisting of repetitive charge-feedback pulses with the input current to the converter, and controls the gated multivibrator so that the pulse repetition rate varies in an appropriate manner to keep the feedback current equal to the instantaneous value of the input current, resulting in the repetition frequency of the gated-multivibrator pulses becoming a digital representation of the analog input current. This technique can provide a dynamic range of $10^7$:1 and can handle input currents as small as $10^{-14}$ A directly without preceding electrometer amplifiers, and it also provides a mechanism for discharging the capacitive divider in a manner such that the circuit automatically establishes its own zero level.

21 Claims, 4 Drawing Figures

WIDE-RANGE CURRENT-TO-FREQUENCY CONVERTER

BACKGROUND OF THE INVENTION 1. Field of the Invention

This invention relates to apparatus for electronic signal processing and more particularly to improved analog-to-digital conversion by apparatus for providing wide-range current-to-frequency conversion in circuits with very low input currents on the order of $1 \times 10^{-14}$ A.

2. Description of the Prior Art

A common problem in constructing various electronic instruments is the quantization of a continuously-varying current or voltage so that subsequent digital data-processing systems can generate useful information based on such analog inputs. This analog-to-digital conversion becomes particularly difficult when the inputs vary over a wide dynamic range, such as $10^7$:1, and when high accuracy must be maintained for very small currents, approaching $10^{-14}$ A. Unique techniques must be employed whenever circuit simplicity, low-power consumption and a low cost are also important.

Small input currents varying over a wide range are commonly produced by many devices such as, for example, ionization chambers used for radiation dosimetry or gas chromatography, photomultiplier tubes viewing light sources of widely-varying intensities, electrodes for collecting free ions or electrons in mass spectrometers or electrostatic analyzers, and large-value resistors for high-impedance voltage measurements.

The output signals from a quantizer handling such input currents generally enter digital data-processing circuits, which may in turn also control the quantizer. These circuits can perform such functions as determining and possibly displaying the instantaneous or average frequency which is proportional to the input current, the total number of pulses produced in a defined time interval which is proportional to the total charge (equal to the integral of the current) applied to the input during that interval, the time during which the frequency and thus the input current exceeds some fixed or adaptive threshold, or any other function commonly performed by digital or analog circuits.

A common application for this type of quantizer involves a small open ion chamber used in a radiation dosimeter which must be small, portable and capable of operating accurately for an extended period of time from batteries. Such an ion chamber will typically produce currents between $3 \times 10^{-14}$ A and $1.8 \times 10^{-7}$ A for the expected range of dose rates (1 mR/min to 6000 R/min) and total charges in a 1.2-s interval from $3.6 \times 10^{-14}$ C to $2.4 \times 10^{-8}$ C, corresponding to a total dose from 0.02 mR to 13 R. A simple, low-power converter with a minimum of controls and adjustments must quantize these currents for processing by subsequent circuits employing mostly COSMOS digital integrated circuits.

Other possible schemes for the analog-to-digital conversion of small input currents covering a wide dynamic range are not as efficient as the current-to-frequency converter described herein. Before developing the analog-to-digital-conversion apparatus herein, other methods were found to be less desirable for the reasons stated hereinafter.

Conceptually, the most straightforward method of digitizing an analog input signal involves a linear electrometer amplifier with resistive feedback followed by a successive-approximation analog-to-digital converter. However, in a given case, the need to resolve $3 \times 10^{-14}$ A when the full-scale current is $1.8 \times 10^{-7}$ A implies a 23-bit converter if the electrometer has only a single fixed feedback resistor. Even if a converter with that many bits were available in an inexpensive form, it would consume a large amount of power and be rather large because of its high complexity. Furthermore, such a system has no convenient method for integration to obtain total charge.

Alternatively, one could use a different conversion scheme than a single-range successive-approximation converter. For example, a voltage-to-frequency converter or a voltage-to-pulse-width converter could operate on the output of the electrometer, or a range-switch could exist between the electrometer and a successive-approximation converter. All such schemes, however, suffer from the problem that, if $1.8 \times 10^{-7}$ A corresponds to a 6-V electrometer output, then a maximum offset drift of $6 \times 10^{-15}$ A (20% of the $3 \times 10^{-14}$-A threshold current) requires a voltage stability of 0.2 $\mu$V. This stability requirement implies mechanical choppers or, more likely, automatic zeroing circuits, and it is difficult to achieve by any method. Thus, one not only has the complexity of the electrometer added to the analog-to-digital converter but also has the need for continuous automatic zeroing. The power, volume and cost penalties associated with this unnecessary complexity are undesirable.

The problem with the stability of the electrometer offset voltage disappears if one performs range switching of the electrometer feedback resistor. Unfortunately, leakage currents for suitable semiconductor switches exceed $6 \times 10^{-15}$ A when several volts are applied across the switch as would be often necessary. (The same argument precludes the use of semiconductors as logarithmic feedback elements or as means for the introduction of discrete amounts of charge at the input.) Thus, the range-changing switch would need to be a mechanical device such as a reed relay. Such devices are bulky and consume substantial operating power. In addition, one would still have a complex system consisting of an electrometer with its range-changing circuitry followed by an analog-to-digital converter.

Clearly substantial circuit simplicity would result if the linear electrometer amplifier could be replaced with a low-leakage comparator amplifier used directly in the quantization process. Such techniques are known in the prior art whenever the input currents were relatively large, the dynamic range is restricted, or the complexity and power consumption of range-switching and zeroing circuits are permitted. Basically these techniques generated a feedback pulse containing a fixed amount of charge, which was subtracted from the input charge that had been stored on a capacitor connected to the input. The comparator amplifier controlled other circuits to vary the rate of application of feedback charge pulses in such a manner as to cause a feedback current at the input which just cancelled the input current. The frequency of application of these known-amplitude charge pulses thus became a digital representation of the input current. Simply counting the pulses from such a current-to-frequency converter then also provided a digital representation of the charge applied to the input during the counting interval.

The prior-art systems generated this feedback charge by driving resistors with constant-width voltage pulses or by connecting other devices to the high-impedance input which have leakage currents exceeding $6 \times 10^{-15}$ A. For example, the discrete charge could be introduced through a grounded-base transistor, through field-effect transistors or through diodes, but such devices generally have leakage currents exceeding $10^{-12}$ A at their required operating voltages, particularly at slightly elevated temperatures, and would require constant and rapid external correction for these offset currents and for the small changes in their values which can easily approach $6 \times 10^{-15}$ A.

For resistive feedback, the offset current problem can be eliminated, but the feedback charge and thus the gain now depends on the width of the pulse driving the resistor as well as on its voltage, thus adding an unnecessary source of inaccuracy and drift, particularly at 5-MHz repetition rates where 1% gain stabilities would imply pulse-width accuracies of 1 ns. Furthermore, the well-known instabilities and excess noise in resistors with values above $10^{10}\ \Omega$, which are needed to measure $3 \times 10^{-14}$ A, become a limiting factor.

Another undesirable property of resistive feedback remains the limited dynamic range unless reed-relay range switching is employed. A ratio between tolerable offset drift and full-scale signal of $3 \times 10^7$:1 with resistive feedback in one range would still require about 0.2-$\mu$V input stability. Even if this stability could be achieved, the noise produced by the relatively-small resistor required to handle the full-scale current at reasonable voltages would be comparable to low-level signals. Thus, range switching is an essential element of the resistively-fedback system.

A final problem with resistive feedback applied to the direct digitization of small currents results from the stray capacitance that always exists across the resistor. The charge coupled through such stray capacitance can easily exceed the charge coupled through the resistor itself. Although, when the resistor drive pulse returns to its quiescent level, it withdraws this capacitive charge, the current spikes caused by the shunt capacitance can raise havoc with the subsequent amplifiers and discriminators which must decide whether or not to add another charge increment to the input. This spiking problem can often convert what appears to be a reasonable design into a marginal circuit requiring careful adjustment and extremely careful component layout to work at all.

In summary the prior-art approaches and their respective disadvantages include the following:

a. A single-range dc electrometer with successive-approximation analog-to-digital converter — requires a 23-bit converter beyond the present state of the art for simple, low-power circuits, requires 0.2-$\mu$V stability, is very complicated, and has no direct provision for integration.

b. A single-range dc electrometer with other forms of analog-to-digital conversion — requires 0.2-$\mu$V stability and is moderately complicated.

c. A multiple-range dc electrometer followed by an analog-to-digital converter — requires a reed relay for range switching, has a large size and power consumption, is moderately complicated, and has no direct provision for integration.

d. Current-to-frequency conversion using charge feedback through semiconductors — cannot acheive the low leakage currents and high impedances necessary to perform the direct digitization of currents as small as $10^{-14}$ A without the complexity of constant external zero correction.

e. Current-to-frequency conversion using charge feedback through a resistor — has an added dependence on pulse width, has the instabilities and noise of large-value resistors, has the need for a stable input voltage, has the need for external zero adjustment or the need for reed-relay range switches, and has inherently marginal operation at low currents caused by transients coupled through the stray capacitance shunting the feedback resistor.

SUMMARY OF THE INVENTION

Applicant herein has conceived of an improved wide-range current-to-frequency converter for use in circuits with input currents as low as $10^{-14}$ A. The system of circuitry operates as an analog-to-digital converter to produce an output frequency proportional to input current. The current-to-frequency converter enables digitization of an input signal by producing a train of discrete output pulses with a repetition frequency proportional to current applied to the input of the converter. The circuit utilizes a low-leakage charge-sensitive amplifier, a gated multivibrator, a charge pulser and a capacitive divider. The gated multivibrator under the control of the charge-sensitive amplifier at the input of the converter produces discrete pulses, which in turn cause the charge pulser to generate discrete units of charge, which are reduced in magnitude by the capacitive divider to become the charge-feedback pulses applied to the input of the charge-sensitive amplifier. This amplifier compares the feedback current consisting of repetitive charge-feedback pulses with the input current to the converter, and controls the gated multivibrator so that the pulse repetition rate varies in an appropriate manner to keep the feedback current equal to the instantaneous value of the input current, resulting in the repetition frequency of the gated-multivibrator pulses becoming a digital representation of the analog input current. This technique can provide a dynamic range of $10^7$:1 and can handle input currents as small as $10^{-14}$ A directly without preceding electrometer amplifiers, and it also provides a mechanism for discharging the capacitive divider in a manner such that the circuit automatically establishes its own zero level.

The present invention provides several features of novelty over the prior art, including the capability to operate over a wide range of input currents and the capability of the system circuit elements to perform and operate over a wide dynamic range including currents as small as $10^{-14}$ A in a non-marginal manner without the use of expensive, complicated and bulky range-changing switches, external zeroing circuits using either automatic or manual techniques, or preceding electrometer amplifiers, thus providing reduced power consumption and cost as well as increased circuit reliability and simplicity.

It is an object of this invention to provide an improved wide-range current-to-frequency converter.

It is an object of this invention to provide a low-level, wide-range, current-to-frequency converter which is nearly independent of the input offset voltage by utilizing a charge-sensitive amplifier, a gated multivibrator, a charge pulser and a capacitive divider, eliminating the need for range switching in the analog circuits, zero adjustment and preceding electrometer amplifiers for the amplification of small currents.

It is another object of this invention to provide a wide-range current-to-frequency converter that will produce a frequency proportional to input current over the range from $3 \times 10^{-14}$ A to $1.8 \times 10^{-7}$ A; have a full-scale frequency of 5 MHz without lockup during overload; function with a long-term accuracy of 2% of value or $6 \times 10^{-15}$ A, whichever is greater, over the temperature range from 0°C to +50°C; be compatible with 1.2-s integration intervals, during which a total of 650,000 pulses may occur; be compatible with a threshold discriminator circuit for timing radiation pulses with a 0.5-ms accuracy from an ion chamber receiving peak dose rates between 0.1 R/s and 100 R/s; contain techniques to vary the charge per pulse from the nominal values in order to compensate for the dependence of the sensitivity of an open ion chamber on pressure and temperature; consume typically less than 40 mW from voltages derived from batteries; avoid paralysis-causing reversed-polarity currents; and be small enough and simple enough for inexpensive packaging in a hand-held instrument.

For a better understanding of the present invention, together with other and further objects thereof, reference is made to the following description taken in connection with the accompanying drawings in which preferred embodiments of the invention are illustrated, the scope of the invention being pointed out and contained in the appended claims.

DESCRIPTION OF THE PREFERRED EMBODIMENTS

Figure 1:
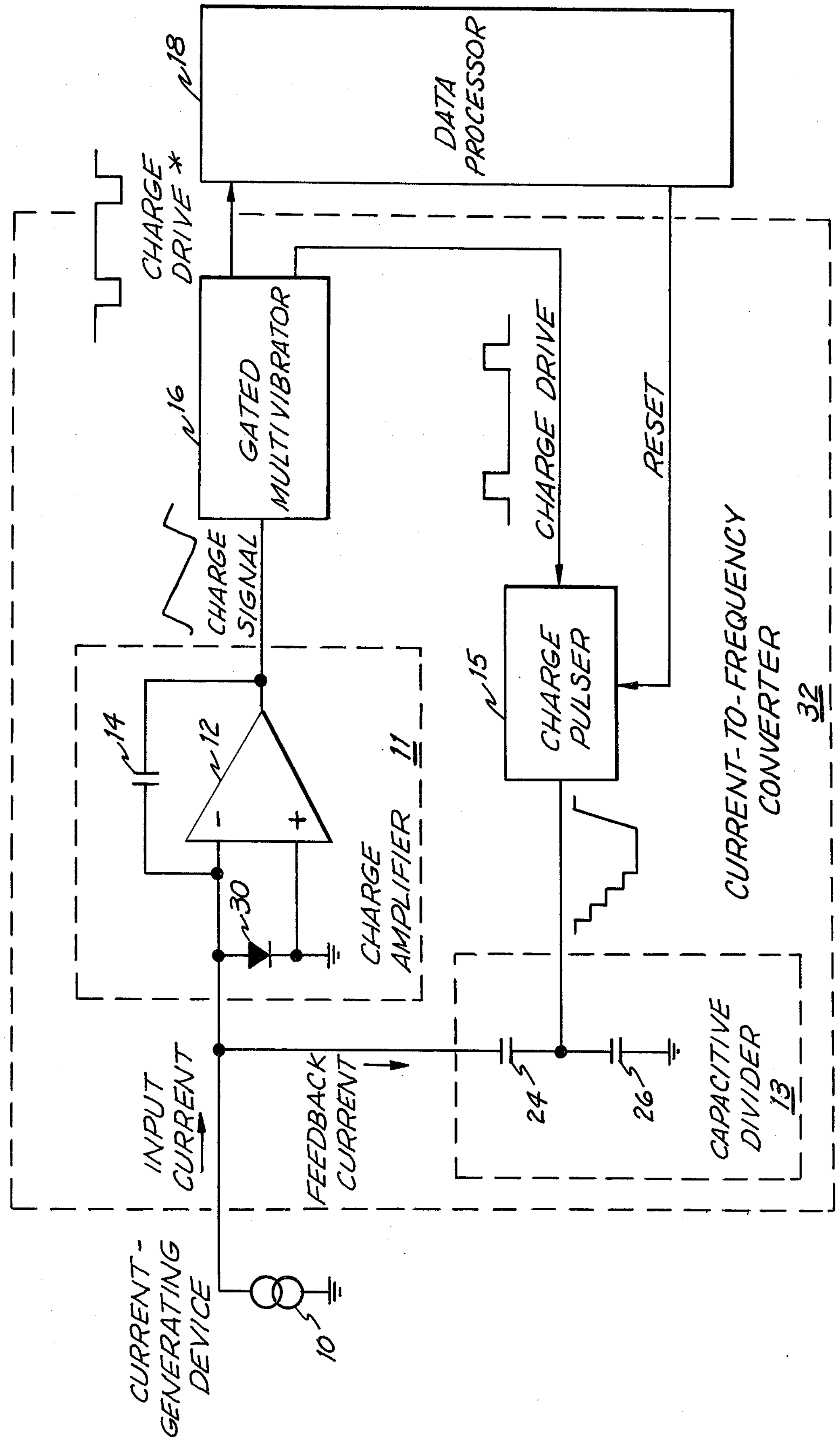
FIG. 1 is a circuit diagram of one embodiment of the wide-range current-to-frequency converter for general application.

Turning to FIG. 1, there is shown in block-diagram form an embodiment of this current-to-frequency converter 32. The converter 32 contains a charge amplifier 11, which produces the CHARGE SIGNAL at its output in response to the INPUT CURRENT from the current-generating device 10 and in response to the FEEDBACK CURRENT flowing through the capacitive divider 13 connected to the charge-amplifier 11 input. The charge amplifier 11 consists of an operational amplifier 12 with feedback through capacitor 14 and with a clamp diode 30 at the input. Other embodiments of a charge amplifier performing the same functions as those described herein are also known to those skilled in the art.

In the embodiment shown in FIG. 1, the INPUT CURRENT flows toward the charge-amplifier input and the FEEDBACK CURRENT flows away from this input. It is obvious to those skilled in the art that the sign of both of these currents could be reversed with appropriate changes in circuit details, or that a fixed current could be introduced at the input or the FEEDBACK CURRENT could have both polarities to permit the handling of bi-polar INPUT CURRENTS. It is also obvious to those skilled in the art that the current-generating device 10 could be a voltage-generating device in series with a large impedance, such as a resistor or capacitor of appropriate value.

As shown in FIG. 1, the INPUT CURRENT causes the CHARGE SIGNAL at the output of the amplifier 12 to move negatively until the gated multivibrator 16 triggers. At that time this circuit generates a positive pulse of fixed duration on the CHARGE-DRIVE line. (The use here of a positive signal of fixed duration is for purposes of illustration only and is not an essential part of this invention.) The logical complement of the CHARGE-DRIVE signal appears as the CHARGE-DRIVE* signal and signifies to the data processor 18 that the gated multivibrator 16 triggered. The pulse repetition rate on the CHARGE-DRIVE line or on other lines logically related to the CHARGE-DRIVE line, such as the CHARGE-DRIVE* signal, contains the output frequency information from the current-to-frequency converter 32.

The CHARGE-DRIVE signal enters the charge pulser 15. Except when it is under control of the RESET signal to be described later, the charge pulser 15 produces a defined increment of charge whenever a positive transition occurs in the CHARGE-DRIVE signal. This charge flows out of the capacitive divider 13, which contains the junction of capacitor 24 with capacitor 26. The other end of capacitor 26 is connected to ground potential, whereas capacitor 24 is connected to the input of the charge amplifier 11. Because the negative feedback through capacitor 14 causes the impedance at the input of the charge amplifier 11 to appear momentarily low, the charge produced by the charge pulser 15 divides between capacitor 24 and capacitor 26 in the ratio of their capacitances. If the capacitance of capacitor 24 is much smaller than that of capacitor 26, then only a small fraction of the charge-pulser 15 output enters the charge-amplifier 11 input through capacitor 24. As a result the FEEDBACK CURRENT may be much smaller than the currents involved in the charge pulser 15, and thus leakage currents and other such error-producing effects associated with the charge pulser 15, which may contain semiconductors, are attenuated by an amount which may exceed 10,000:1. The capacitive divider 13, which in itself may have impedances for direct currents exceeding $10^{14}$ Ω and also very low leakage currents, has thus attenuated the deleterious leakage effects associated with semiconductors and other electronic components, which, if connected directly to the charge-amplifier 11 input, would prevent accurate operation for INPUT CURRENTS as small as $10^{-14}$ A.

In response to that portion of the charge-pulser 15 output signal coupled through capacitor 24 to the input of the charge amplifier 11, the CHARGE SIGNAL at the output of amplifier 12 rises rapidly. After a time interval equal to approximately twice the width of the positive pulse on the CHARGE-DRIVE line, the gated multivibrator 16 interrogates the CHARGE SIGNAL. If this signal has not risen sufficiently to exceed the threshold of the gated multivibrator 16, it proceeds to generate a second CHARGE-DRIVE pulse. This sequence continues until the output voltage of amplifier 12 rises above the threshold level.

Thus, the output of amplifier 12 oscillates about the threshold voltage of the gated multivibrator 16 such that the charge removed from the input of amplifier 12 through capacitor 24 equals the charge supplied at the input by the current-generating device 10. Whenever each positive transition of the CHARGE-DRIVE signal causes a fixed charge to be withdrawn from the amplifier 12 input, the repetition rate of CHARGE-DRIVE signals is proportional to the INPUT CURRENT.

It is well known to those skilled in the art that, if the feedback charge were varied in a known way dependent on input signal, then the dynamic range of the converter could be further increased. For example, the data processor 18 could command a change in the capacitive division ratio of the capacitive divider 13, or the charge pulser 15 could provide a varying charge output. Furthermore, the combination of the gated multivibrator 16 with the charge pulser 15 is just one possible mechanization of a charge-generating device, which produces known, discrete charge impulses under the control of the charge amplifier 11 and the data processor 18, and which signifies to the data processor 18 whenever it has produced such a charge impulse. Such a charge-generating device could produce bi-polar as well as uni-polar charge pulses and could signify to the data processor 18 which polarity it was producing, in order to permit the quantization of bi-polar input currents.

Returning to the embodiment shown in FIG. 1, the action of the overall feedback loop of the converter 32 causes the voltage across capacitor 26 to fall negatively. In order to avoid excessive voltages across capacitor 26 and the saturation of the charge pulser 15, the data processor 18 must occasionally interrupt the quantizing process in order to discharge the capacitors in the capacitive divider 13. At such times, the RESET signal commands the charge pulser 15 to return its output to near ground potential, forcing a positive current through capacitor 24 into the charge amplifier 11. This relatively large current places the clamp diode 30 in conduction, which provides a dc path for the recharging of capacitor 24. After the current pulse in capacitor 24 dies away, diode 30 stops conducting after drawing the input of amplifier 12 back toward its quiescent value.

Because the impedance of diode 30 becomes very high before the quiescent value is finally reached, this decay is only asymptotic and often must be speeded up by a feedback mechanism. This speed up may be allowed to occur automatically in that the CHARGE SIGNAL at the output of amplifier 12 is below the threshold of the gated multivibrator 16 during the reset sequence, causing CHARGE-DRIVE pulses to be generated continuously at their maximum rate. These pulses will continue until the output of amplifier 12 returns to its quiescent value just above the threshold of the gated multivibrator 16. During this reset period, the data processor 18 should ignore the output of the current-to-frequency converter 32. Such a reset sequence should precede each integration interval.

The time required for this reset sequence, which is a time during which the current-to-frequency converter 32 is not processing an input signal, equals the sum of the time required for the charge pulser 15 to discharge the capacitive divider 13 and the time for the current produced by the gated multivibrator 16 and the charge pulser 15 operating at their maximum frequency to return the CHARGE SIGNAL at the output of amplifier 12 to its quiescent level. This latter time under some circumstances can lead to an excessive converter "dead time," and thus a secondary feedback mechanism not shown in FIG. 1 is sometimes desirable for restoring normal converter operation more rapidly. One such technique involves connecting the cathode of diode 30 to the output of amplifier 12 while the capacitive divider 13 is being discharged instead of to ground potential as shown in FIG. 1; during the normal conversion process the cathode of diode 30 is returned to ground potential. This modification of the basic reset sequence permits the output of amplifier 12 to restore rapidly its own input to near its quiescent value, substantially reducing the number of CHARGE-DRIVE pulses necessary to perform this function and thus eliminating one of the major sources of converter dead time.

Both of these reset sequences have the property that the current-to-frequency converter 32 repeatedly establishes its own zero level at a rate given by the rate of occurrence of RESET pulses. As a result, the converter 32 automatically nulls out the effects of varying offset voltages at its input at frequent intervals, allowing it to provide accurate operation over a dynamic range of $10^7$:1. If the operational amplifier 12 has a balanced input stage, then this nulling process forces the input to rest near ground potential, thus reducing leakage currents through diode 30, capacitor 24 and any other components connected to the input. Thus, the use of capacitive divider 13 to introduce the FEEDBACK CURRENT, together with a reset sequence which automatically compensates for varying amplifier offset voltages and forces the converter 32 input to remain near ground potential, permits accurate operation over a wide range of INPUT CURRENTS, which may be as small as $10^{-14}$ A, without external zeroing circuits or electrometer amplifiers.

Figure 2:
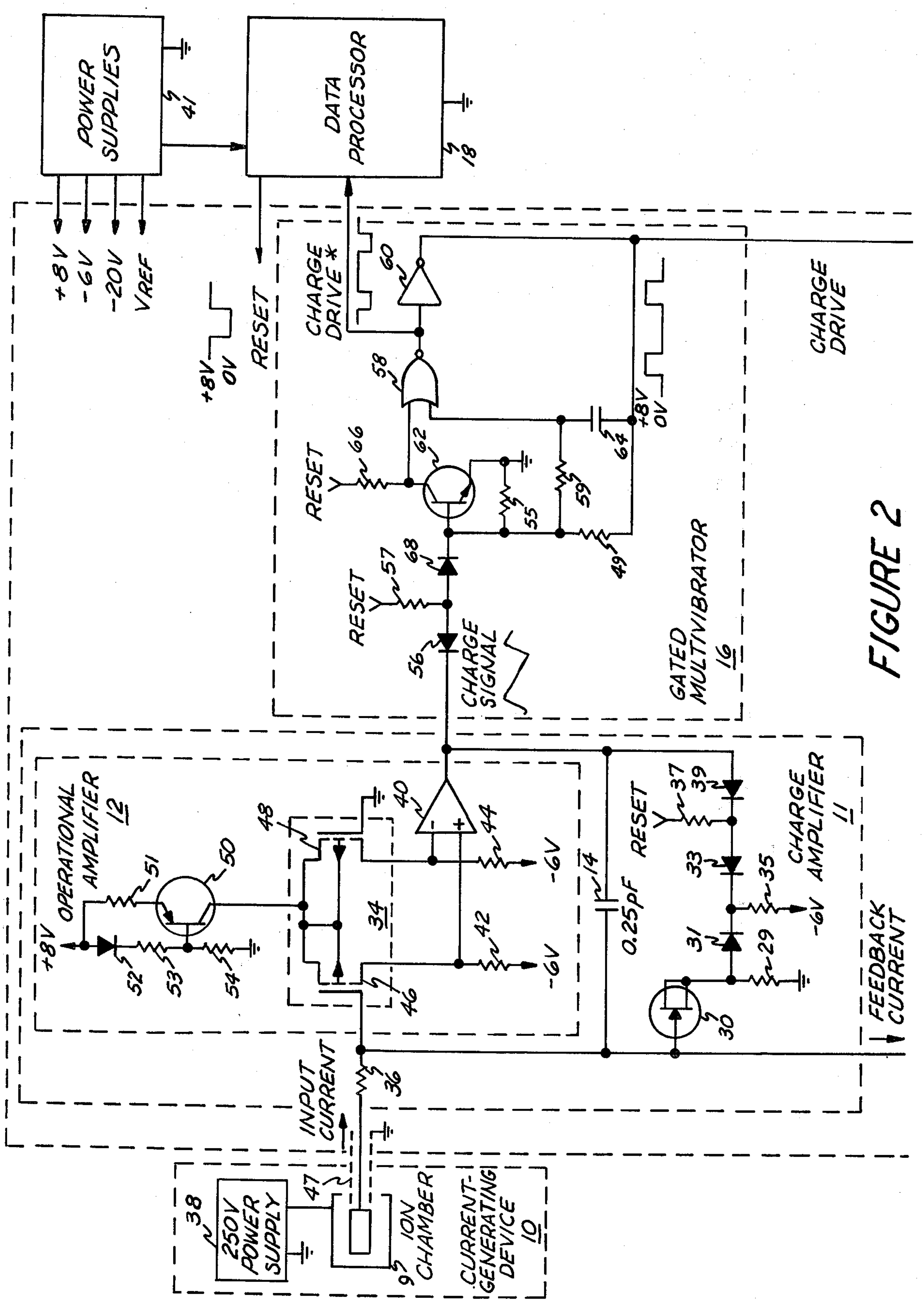
FIGS. 2 and 3, which are related to one another as shown in FIG. 4, together provide a circuit diagram of a system combining this converter, having a charge-sensitive amplifier, a gated multivibrator, a charge pulser and a capacitive divider, with an ion chamber and a digital data processor used in radiation dosimetry.
Figure 3:
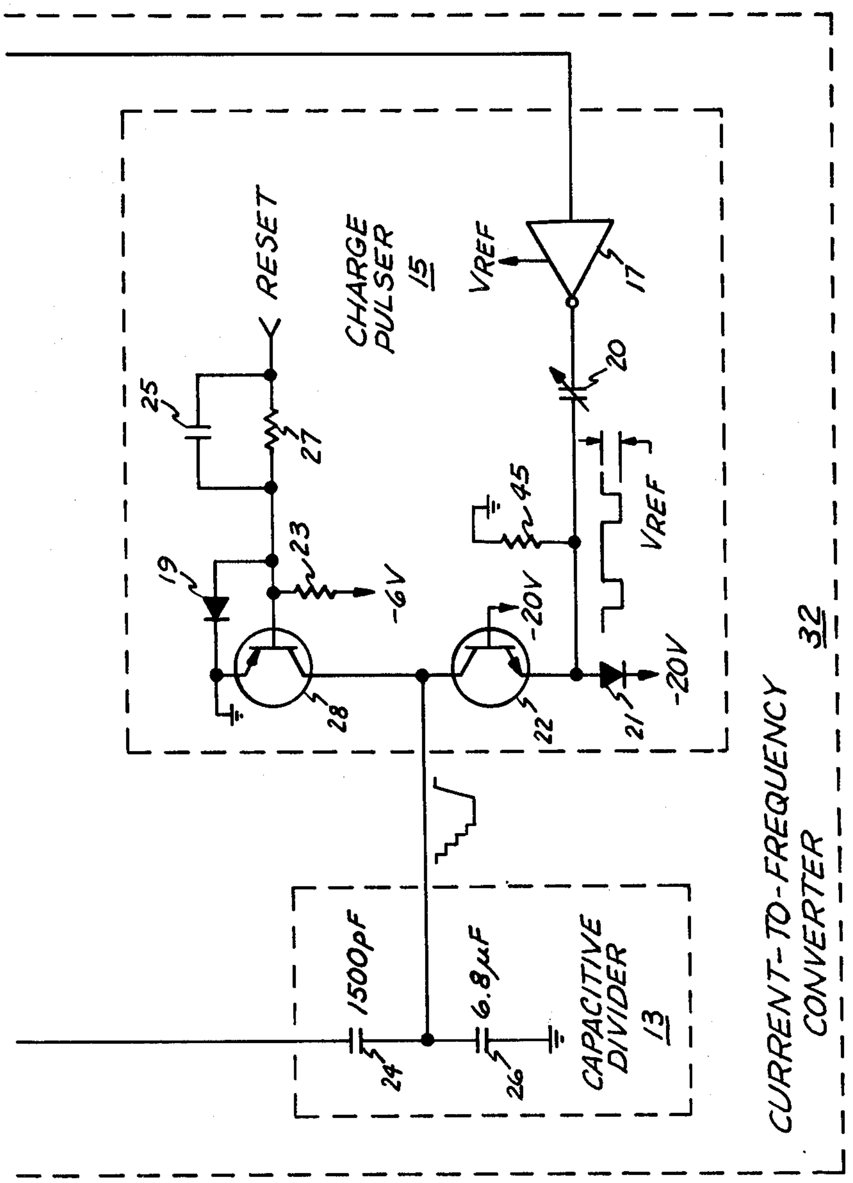
Figure 4:
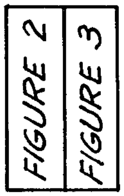

Turning now to FIGS. 2, 3 and 4, one sees the details of the charge amplifier 11, the gated multivibrator 16, the charge pulser 15 and the capacitive divider 13 described above as they were implemented in one embodiment of this type of current-to-frequency converter. (FIG. 4 shows the relationship between FIGS. 2 and 3, which together constitute this embodiment.) In this case the current-generating device 10 is an ion chamber 9 with its 250-V bias supply 38 as used in radiation dosimetry. This ion chamber 9 is exposed to dose rates from 1 mR/min to 6000 R/min and has a sensitivity of about $3 \times 10^{-14}$ A at 1 mR/min. Total exposures will range between 0.02 mR and 13 R, corresponding to input charges between $3.6 \times 10^{-14}$ C and $2.4 \times 10^{-8}$ C.

The current from ion chamber 9 enters the current-to-frequency converter 32 through a 10-MΩ resistor 36. This resistor 36 limits the INPUT CURRENT in the event of an inadvertent ion-chamber 9 short circuit or arc to about 30 μA, which, because of the clamping action of diode 30 and capacitor 24, cannot damage the charge amplifier 11. Additionally, the 300-μs smoothing time constant caused by the 30-pF ion-chamber 9 and cable 47 capacitance and resistor 36 will hold the INPUT CURRENT below the 0.18-μA full-scale value even if 50 pC were to be applied suddenly to the input. Thus, the input network will maintain the circuit within its linear operating range for such current "spikes," as well as protecting it against arcs from the ion-chamber 9 or high-voltage supply 38, while producing an acceptable 0.3-ms time delay. It also will strongly attenuate any high-frequency ripple present on the 250-V supply 38.

The INPUT CURRENT then enters the charge amplifier 11 with a transfer capacitance given approximately by the 0.25-pF value of the feedback capacitor 14. Except during the reset sequence when diode 30 conducts, this amplifier 11 functions as a standard charge-sensitive amplifier with capacitive feedback from the output to the inverting input. Because the overall feedback loop of the converter 32 contains the amplifier 11, its transfer capacitance needs to be only moderately stable and predictable.

In order to reduce input leakage current as much as possible, the input stage 34 of the operational amplifier 12, which provides the gain for the charge amplifier 11, is a dual MOSFET containing individual matched transistors 46 and 48. Because the current-to-frequency converter 32 automatically nulls out any voltage offsets during the reset sequence, the offset voltage of the charge amplifier 11 is not particularly critical. This advantage is indeed fortunate in that the threshold signal level of $3.6 \times 10^{-14}$ C represents a voltage of only 24 $\mu$V across the 1500-pF capacitor 24 connected to the input. Because this voltage accuracy cannot be maintained using MOSFETs except for short periods of time, other configurations would require the complexity of automatic or manual zero-correcting circuits or range switches. Transistor 50, diode 52 and resistors 51, 53 and 54 provide a temperature-compensated operating current for the dual MOSFET 34.

An integrated-circuit or discrete-component amplifier 40 provides the necessary gain to obtain a closed-loop rise time sufficiently fast to allow the charge amplifier 11 to respond on a pulse-by-pulse basis even when charge pulses are applied at a 5-MHz rate. Additionally, amplifier 40 maintains nearly equal voltages across resistors 42 and 44, balancing the drain currents of MOSFETs 46 and 48 for equal values for resistors 42 and 44. Proper choice of the values of resistors 51, 42 and 44 then allows the input stage 34 to operate with only a small gate-drain voltage. Because MOSFETs 46 and 48 are a matched pair, balancing their drain currents and voltages makes their gate-source voltages approximately equal, resulting in the input operating near ground potential.

With only small voltages across diode 30 or from gate to drain of MOSFET 46, one of the principal sources of input leakage current results from the finite resistance between the gate and the source and body of MOSFET 46. This resistance in one embodiment generally reaches $4 \times 10^{15}$ Ω for MOSFET 46, producing an offset current of $1 \times 10^{-15}$ A for the typical 4-V gate-source potential. Furthermore, the use of a junction FET 30 connected as a diode provides a typical leakage resistance to ground at the input of $3 \times 10^{13}$ Ω, so long as the RESET signal is near +8-V, holding diode 31 out of conduction. This leakage conductance will dominate other leakage paths at the input so long as the input contacts only high-resistivity materials, such as polytetrafluoroethylene, and is carefully guarded by grounded shields from conductors at other than ground potential. If the matching of MOSFETs 46 and 48 maintains the input within 30 mV of ground, these leakage paths will contribute $1 \times 10^{-15}$ A to the offset current.

Capacitor 24 of the capacitive divider 13 is also connected to the charge-amplifier 11 input and in one embodiment couples 1/4530 of the charge output of the charge pulser 15 into the charge amplifier 11. Each pulse from the charge pulser 15 then contains 166 pC, so that 36.6 fC reaches the charge-amplifier 11 input through capacitor 24. In response to each such pulse, the CHARGE SIGNAL at the output of the charge amplifier 11 will rise 91 mV owing to its 0.25-pF transfer capacitance.

The leakage currents of transistors 22 and 28 also contribute to the effective input leakage after being multiplied by the ratio of the capacitance of capacitor 24 to the sum of the capacitances of capacitors 24 and 26. In one embodiment this ratio is 1/4530, and the resultant equivalent input leakage current becomes $4 \times 10^{-15}$ A.

The maximum offset current of $6 \times 10^{-15}$ A is sufficiently small compared to the $3 \times 10^{-14}$-A threshold current so that an offset-current adjustment is not necessary. Also, the gate-source and gate-body leakage current flows toward the gate 58, which is in the same direction as the current from ion-chamber 9. As a result, leakage current generally does not drive the charge amplifier 11 backwards into a paralyzed state but at worst only causes a few extra pulses from the current-to-frequency converter 32.

The CHARGE SIGNAL produced by the charge amplifier 11 enters the gated multivibrator through the gating circuit consisting of diodes 56 and 68 and resistor 57. Except during the reset sequence, the RESET signal produced by the data processor 18 has a value near +8 V, permitting the CHARGE SIGNAL to saturate transistor 62 whenever the signal level exceeds the threshold near 0.6 V. In that case with no INPUT CURRENT present, the output of nor gate 58 is high, with the output of inverter 60 low, because both inputs to gate 58 are low. The CHARGE-DRIVE signals thus remain fixed, and no feedback charge passes through transistor 22, leaving the CHARGE SIGNAL constant. If an ion-chamber 9 current then begins and causes the CHARGE SIGNAL to fall by about 25 mV, transistor 62 stops conducting, and the collector of transistor 62 starts to rise toward +8 V. After 0.1 $\mu$s the output of gate 58 changes state, producing a negative transition in the CHARGE-DRIVE* signal. This negative transition results in a low-to-high transition of CHARGE-DRIVE after inversion by inverter 60. This transition coupled through capacitor 64 to one input of gate 58 temporarily holds the output of gate 58 low even if transistor 62 saturates. In fact, this same signal coupled through resistors 49 and 59 saturates transistor 62, causing the capacitance at the collector of transistor 62 to decay toward ground potential.

After 0.1 $\mu$s from the positive transition of the CHARGE-DRIVE signal, the voltage on the gate 58 side of capacitor 64 decays sufficiently through resistor 59 so that the output of gate 58 returns to the high state, causing the output of inverter 60 to fall to the low state. This transition will cut off transistor 62 because of the currents in resistors 49, 55 and 59, permitting its collector to rise, only if the CHARGE SIGNAL is still below the base-emitter threshold voltage of transistor 62. In this case, the collector voltage of transistor 62 will rise to the threshold voltage of gate 58 in 0.1 $\mu$s, at which time the above-described sequence repeats. Thus, so long as the CHARGE SIGNAL remains below the threshold voltage of transistor 62, the gated multivibrator 16 will generate a 5-MHz square wave at both its CHARGE-DRIVE and CHARGE-DRIVE* outputs.

The CHARGE-DRIVE signals enter the charge pulser 15 through inverter 17, which has a variable supply voltage called $V_{REF}$. When the CHARGE-DRIVE signal makes a positive transition, the output voltage from inverter 17 makes a negative transition with an amplitude determined by $V_{REF}$. Because the gain of the converter 32 is proportional to the amplitude of this transition, varying $V_{REF}$ appropriately can provide compensation for changes in pressure or temperature in the ion chamber 9.

The signals from inverter 17 proceed through variable capacitor 20 to the emitter of transistor 22. The end of capacitor 20 connected to the emitter of transistor 22 normally rests slightly above −20 V owing to the conduction of diode 21 as a result of the current in resistor 45. When the signal at the output of inverter 17 makes a negative transition, diode 21 stops conducting, and capacitor 20 charges negatively through the emitter of transistor 22, drawing out a charge equal approximately to the magnitude of $V_{REF}$ multiplied by the capacitance of capacitor 20. When the CHARGE-DRIVE signal returns to ground potential, the charge on capacitor 20 is restored through diode 21. In this manner, each CHARGE-DRIVE pulse transfers nominally 166 pC to the collector of transistor 22. Except during the reset sequence, the RESET signal supplies sufficient current through resistor 27 to exceed the current in resistor 23, forcing diode 19 into conduction and cutting off transistor 28. As a result, all of the charge reaching the collector of transistor 22 proceeds to the capacitive divider 13, causing a pulse containing 36.6 fC as part of the FEEDBACK CURRENT to be removed from the input of the charge amplifier 11.

This signal propagates through the charge amplifier 11 to the base of transistor 62 in the gated multivibrator 16. When a sufficient amount of charge has been transferred to the charge-amplifier 11 input to cause the CHARGE SIGNAL to rise above the emitter-base threshold voltage of transistor 62, that transistor 62 saturates. So long as transistor 62 is saturated, the gated multivibrator 16 ceases to produce output pulses. When the CHARGE SIGNAL subsequently decays below the threshold voltage of transistor 62, the gated multivibrator 16 will produce an output pulse 0.1 $\mu$s later. Thus the number of these pulses is precisely proportional to the ion-chamber 9 charge within the 36.6 fC resolution given by the magnitude of the discrete feedback charge. The exact waveform of the FEEDBACK CURRENT is not critical in that the sensitivity of the converter 32 depends only on the total charge transferred, which in turn depends mainly on the stable values of capacitors 24, 26 and 20 and of $V_{REF}$. Adjustment of variable capacitor 20 allows the converter 32 to be calibrated easily to eliminate the effects of component tolerances.

This action causes the voltage at the collector of transistor 22 to fall negatively. In one embodiment, the values of capacitors 20, 24 and 26 are chosen such that each pulse draws nominally 36.6 fC from the charge-amplifier 11 input, causing the voltage across capacitor 24 and thus at the collector of transistor 22 to fall by 24.4 $\mu$V. When the maximum input charge is 24 nC, corresponding to a radiation dose of 13 R and 650,000 pulses, then the collector of transistor 22 must be able to fall by at least 15.4 V.

In order to avoid saturation of transistor 22, capacitors 24 and 26 must be occasionally discharged by saturating transistor 28. During the first 2 ms of this reset sequence, the RESET signal falls to ground potential, and the resulting currents in capacitor 25 and resistor 23 hold transistor 28 in conduction. As a result, the voltage at the collector of transistor 22 returns to ground potential, forcing a positive current through capacitor 24 into the charge amplifier 11. This relatively large current places diode 30 in conduction, which provides a dc path for the recharging of capacitor 24 through resistor 29.

During this period the output of amplifier 40 falls to near ground potential. Because RESET is also near ground potential at that time, the current in resistor 35 flows in diode 31 instead of in diode 33 as was the case when the RESET signal was high. The presence of this current in resistor 29 depresses the voltage at the cathode of diode 30, allowing it to discharge capacitor 24 until it nearly reaches the threshold voltage of the charge amplifier 11. At that time the output voltage of amplifier 40 will rise, causing the current in resistor 35 to flow partly in diodes 33 and 39 in such a way as to hold the voltage at the input of the charge amplifier 11 near its threshold value. During this period the absence of voltage across resistor 66 prevents the gated multivibrator 16 from generating CHARGE-DRIVE pulses.

After 2 ms have passed, the data processor 18 returns the RESET signal to its high state. This action opens the feedback loop through diode 30 by forcing diodes 31 and 39 out of conduction as a result of the current in resistors 35 and 37 and restores normal operation of the gated multivibrator 16 and charge pulser 15 with the voltage at the input to the charge amplifier 11 slightly above its quiescent value. The total digitizer loop is now closed in its standard operating mode. As a result, the charge pulser 15 will now produce a sufficient number of charge pulses to bring the voltage at the output of the charge amplifier 11 to a point just above the threshold of the gated multivibrator 16, thus automatically establishing the proper voltage at the input to the charge amplifier 11 and compensating for the small differences in the gate-source voltages of MOSFETs 46 and 48. During this recovery period lasting about 0.2 ms at the end of the reset sequence, the data processor 18 ignores the CHARGE-DRIVE* output of the gated multivibrator 16 in order that changes in the number of pulses produced in the recovery process do not change the results obtained from digitizing an INPUT CURRENT.

In one embodiment of this circuit, the total power consumption from power supplies 41 while digitizing low-level signals was 38 mW, falling to 16 mW during the reset sequence, which was also used as a standby mode. During periods when the CHARGE-DRIVE* signals were appearing at a 5-MHz rate and were traveling over a coaxial cable with a 6-m (20 ft) length, the operating power increased to 153 mW. These power levels show that this digitizer is consistent with small, portable, battery-powered instruments. Noise levels were such that the rms variations in the charge measured in 1.2 s were about ±30 fC.

What is claimed as new is:

1. For use in combination in a circuit capable of quantizing small currents, an improved wide-range current-to-frequency converter comprising:

a. amplifier means, adapted to receive an input current having a signal current and repetitive discrete feedback charge pulses, for providing a comparison between the charge arising from the signal current and the total discrete feedback charge, and for producing an output voltage proportional to the difference between the total feedback charge and the total charge produced by the signal current;

b. charge-generating means, connected to the output of the amplifier means, for producing known amounts of charge at a charge output whenever the amplifier means indicates that the feedback charge has a smaller absolute magnitude than the input charge, and for producing at those times frequency output pulses whose repetition rate becomes an output frequency signal; and c. capacitive-divider means, connected between the charge output of the charge-generating means and the input to the amplifier means, for attenutating the charge generated by the charge-generating means, to produce said repetitive discrete feedback charge pulses;

whereby, analog-to-digital conversion is accomplished by producing a train of pulses at the frequency output with a repetition frequency related in a known way to the signal current applied to the input of the current-to-frequency converter.

2. The circuit of claim 1, above, further comprising a pulse-generating means connected to the charge-generating means, said pulse-generating means producing pulses which cause the capacitive-divider means to be discharged in such a fashion that the current-to-frequency converter establishes its own zero level, permitting operation over a wide range of input currents.

3. The circuit of claim 1, above, wherein the feedback charge is fixed and constant so that the output frequency of the converter is proportional to the input current.

4. The circuit of claim 1, above, wherein the converter measures linearly input currents between $3 \times 10^{-14}$A and $1.8 \times 10^{-7}$A.

5. The circuit of claim 1, above, wherein the converter measures linearly input currents between $3 \times 10^{-14}$A and $1.8 \times 10^{-7}$A, corresponding to input charges between $3.6 \times 10^{-14}$C and $2.4 \times 10^{-8}$C for 1.2-s integration intervals.

6. The circuit of claim 1, above, wherein said amplifier means comprises a charge-sensitive amplifier having offset currents, input voltages and noise, which generate negligible errors in relation to threshold signals applied to the converter.

7. The circuit of claim 1, above, wherein said amplifier means comprises a MOSFET in its input stage.

8. The circuit of claim 1, above, wherein the value of the capacitive division provided by said capacitive-divider means can be changed in order to extend the dynamic range of the converter.

9. The circuit of claim 1, above, wherein said capacitor-divider means comprises high-resistivity, low-leakage capacitors to reduce leakage currents at the converter input.

10. The circuit of claim 9, above, wherein said capacitor-divider means provides for the attenuation of leakage-current effects arising in the charge-generating means.

11. The circuit of claim 1, above, wherein said charge-generating means comprises gated-multivibrator means and charge-pulser means, connected to the gated-multivibrator means.

12. The circuit of claim 11, above, wherein said charge-pulser means comprises a circuit for changing the voltage across a capacitor in defined, discrete steps under the control of an external signal.

13. The circuit of claim 11, above, wherein said charge-pulser means produces positive charges under the control of one external signal and negative charges under the control of another external signal.

14. The circuit of claim 11, above, wherein said charge-pulser means produces a charge with its polarity controlled by one external signal, with the time of occurrence of the charge pulse being determined by a second external signal.

15. The circuit of claim 11, above, wherein said charge-pulser means provides for charging a capacitor in defined, discrete steps under the control of an external signal and also provides for discharging said capacitor rapidly under the control of a second external signal.

16. The circuit of claim 11, above, wherein said gated-multivibrator means comprises a circuit for producing a pulse with a fixed width whenever a control signal falls below the threshold voltage for a defined length of time.

17. The circuit of claim 16, above, wherein said gated-multivibrator means produces a train of output pulses with a defined minimum pulse separation whenever the control signal remains constantly below the threshold voltage.

18. The circuit of claim 11, above, wherein said charge-pulser means comprises:

a. a transistor operated in the grounded-base mode with its collector connected to the output terminal of the charge-pulser means;

b. a coupling capacitor connected to the emitter of said transistor for providing charge pulses upon command by an external signal; and c. a diode connected between the emitter and the base of the transistor with the opposite polarity as the emitter-base junction of the transistor, whereby charge pulses are produced at the output terminal of the charge pulser whenever the external signal causes the coupling capacitor to be charged through the emitter of the transistor after said coupling capacitor has been discharged through the diode.

19. The circuit of claim 18, above, further comprising a second transistor of opposite polarity to the grounded-base transistor connected between the output terminal of the charge pulser and a defined voltage, said second transistor permitting an additional external signal to switch the output terminal of the charge pulser to a defined voltage by saturating said second transistor.

20. The circuit of claim 16, above, wherein said charge-pulser means provides for a varying charge output by changing the magnitude of the external signal and by changing the value of the coupling capacitor.

21. The circuit of claim 18, above, further comprising an inverter with a variable reference voltage, connected to the coupling capacitor and the external signal, said inverter, upon command by the external signal, producing voltage steps with a magnitude controlled by the variable reference voltage.

* * * * *